United States Patent
Fayneh et al.

(10) Patent No.: US 6,914,490 B2
(45) Date of Patent: Jul. 5, 2005

(54) METHOD FOR CLOCK GENERATOR LOCK-TIME REDUCTION DURING SPEEDSTEP TRANSITION

(75) Inventors: Eyal Fayneh, Givatayim (IL); Ernest Knoll, Haifa (IL)

(73) Assignee: Ibtel Corporation, Santa Clara, CA (US)

( * ) Notice: Subject to any disclaimer, the term of this patent is extended or adjusted under 35 U.S.C. 154(b) by 55 days.

(21) Appl. No.: 10/446,724

(22) Filed: May 29, 2003

(65) Prior Publication Data

US 2004/0251970 A1 Dec. 16, 2004

(51) Int. Cl.⁷ ................................................. H03L 7/00
(52) U.S. Cl. ............................. 331/16; 331/25; 331/34
(58) Field of Search ............................... 331/16, 25, 34

(56) References Cited

U.S. PATENT DOCUMENTS

| | | | |
|---|---|---|---|
| 6,329,882 B1 | * | 12/2001 | Fayneh et al. ................. 331/10 |
| 6,763,478 B1 | * | 7/2004 | Bui ............................. 713/600 |
| 2001/0017572 A1 | * | 8/2001 | Harpham ....................... 331/14 |

OTHER PUBLICATIONS

Milman, Microelectronics Digital and Analog Circuits and Systems, McGraw–Hill Book Company, 1979 pp 313–315.*

* cited by examiner

Primary Examiner—Michael B Shingleton
(74) Attorney, Agent, or Firm—Fleshner & Kim, LLP

(57) ABSTRACT

A method for controlling a phase-locked loop includes receiving a frequency change signal and electrically isolating a VCO control node of the phase-locked loop from at least one charge pump of the loop. During this isolation period, the VCO control node voltage is held at a constant value equal to the voltage that existed before the frequency change signal was received. One or more parameters of the PLL are then altered in a manner that will ensure generation of a newly desired output frequency. These parameters include but are not limited to a feedback divider value and a reference frequency input into the PLL. The new output frequency may be above or below the pre-change signal frequency depending, for example, on a mode of operation of a host system. When the VCO control node is once again electrically connected to the charge pump, the PLL locks on to the desired output frequency. Through this method, frequency change is accomplished without performing a startup process and the time to perform a frequency acquisition process is significantly reduced.

44 Claims, 5 Drawing Sheets

METHOD FOR CLOCK GENERATOR LOCK-TIME REDUCTION DURING SPEEDSTEP TRANSITION

BACKGROUND OF THE INVENTION

1. Field of the Invention

This invention relates to generating signals, and more particularly to an apparatus and method for controlling the operation of an oscillation circuit such as a phase-locked loop. The invention is also an apparatus and method for controlling power consumption in a system which includes an oscillation circuit.

2. Description of the Related Art

Next-generation communications systems and processing architectures will be expected to meet higher performance requirements than are currently attainable. In order to achieve this goal, various power control methods have been proposed. One method involves altering an operating frequency of the system based on the detection of a certain condition. For example, the system may be driven at a low frequency/low voltage supply to save power and at a high frequency/high voltage supply in high-performance mode.

The operating frequencies of electronic devices are typically generated by a phase-locked loop (PLL). This circuit has proven to be desirable because of its ability to produce a stable output frequency. Because of this property, PLLs are commonly used to generate mixing signals in communications systems, clock signals for controlling the speed and synchronizing the operation of microprocessor systems, and timing signals for transferring data in various data storage applications.

In order to perform the aforementioned power control method, the phase-locked loop must be appropriately controlled. More specifically, the phase-locked loop must be controlled so that its output transitions from one operating frequency to another. For example, when the operating mode of the system demands lower performance, the PLL may be controlled to generate a lower operating frequency than is used for a maximum performance operating mode.

The foregoing methods have proven undesirable because a startup operation must be performed as a necessary prerequisite to changing the output frequency of the phase-locked loop. During this startup operation, the control voltage for setting the output frequency of the PLL is set to a predetermined low value. This causes the output frequency to be proportionately high and in fact not related to the newly desired frequency. In order to achieve the new frequency, the control voltage is increased from its predetermined low value up to a value which will produce the desired output. The time required to increase the control voltage in this manner, however, significantly lengthens the lock time (or re-lock time) of the phase-locked loop, thereby adversely affecting the performance of the host system.

DESCRIPTION OF THE PREFERRED EMBODIMENTS

Figure 1:
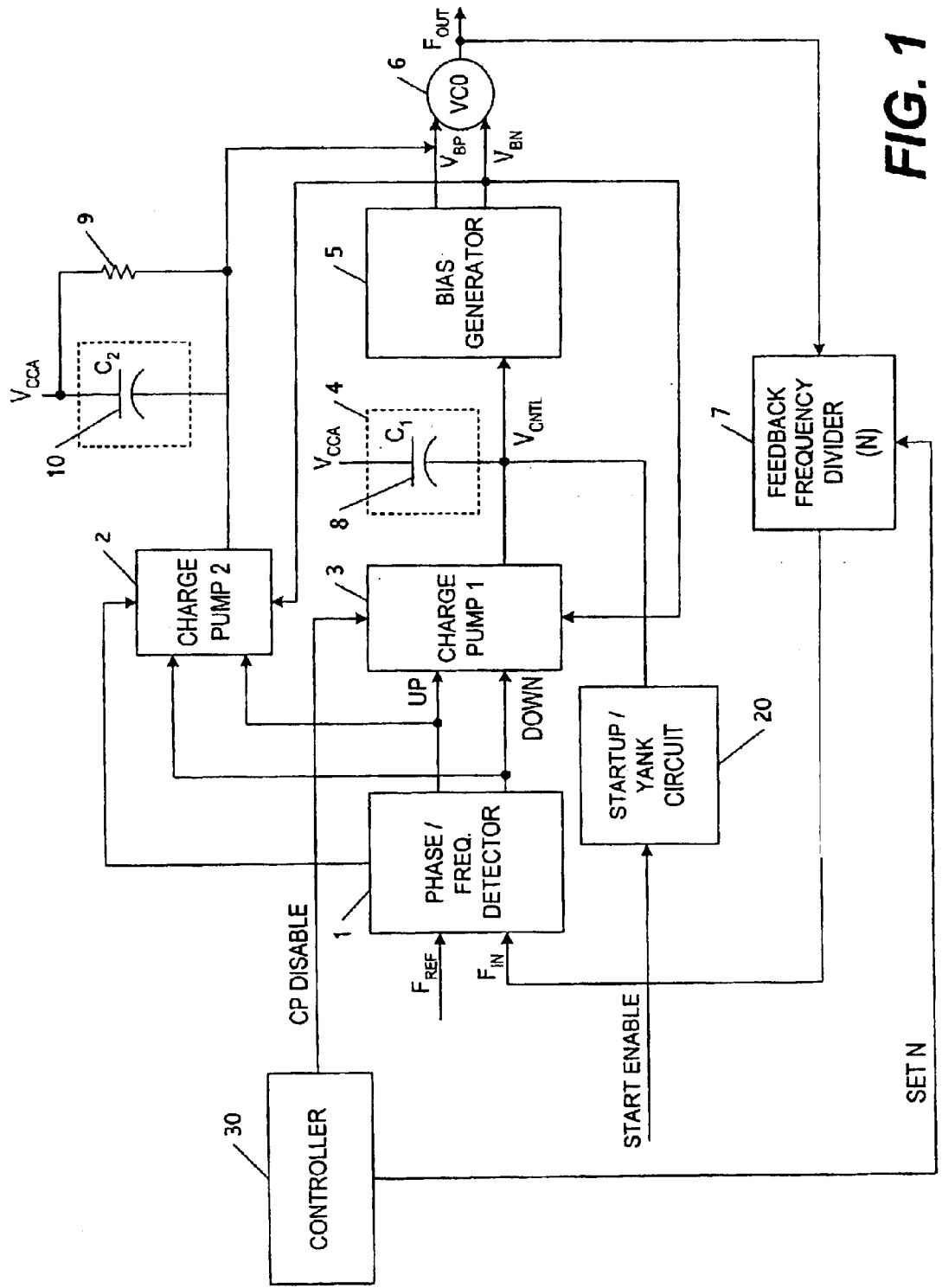
FIG. 1 is a diagram showing a controller for controlling the lock time of a phase-locked loop in accordance with an embodiment of the present invention.

FIG. 1 shows a self-biased phase-locked loop circuit in accordance with one embodiment of the present invention. This circuit includes a phase-frequency detector 1, first and second charge pumps 2 and 3, a loop filter 4 connected to the first charge pump, a bias generator 5 connected to the loop filter, and a voltage-controlled oscillator 6. The bias generator generates an nbias voltage $V_{BN}$ based on a control voltage $V_{cntl}$ output from the first charge pump. The nbias voltage $V_{BN}$ sets a bias of the voltage-controlled oscillator and charge pumps in order to bias the circuit based on a predetermined current value. In addition to these features, a divider 7 may be included along a feedback path. The divider may be, for example, a 1/N programmable divider.

The phase-frequency detector compares a reference frequency $F_{ref}$ with a feedback frequency $F_{in}$ output from the divider and generates one of an Up signal and a Down signal based on the comparison. If the reference frequency leads the feedback frequency, an Up signal pulse may be applied to the charge pumps. Conversely, if the reference frequency lags the feedback frequency, a Down signal pulse may be applied. Those skilled in the art can appreciate that the signals may be reversed depending upon whether the voltage-controlled oscillator has positive or negative gain. Also, the width of the Up pulse or Down pulse (whichever is applied) is proportional to the phase difference between $F_{ref}$ and $F_{in}$.

The output of charge pump 3 is input into a capacitor 8 of the loop filter and the bias generator. The loop filter capacitor performs at least two functions. First, this capacitor integrates the current signal output from the first charge pump to produce a smooth control voltage (e.g., $V_{cntl}$) input into the bias generator. The bias generator converts this voltage into a signal nbias $V_{BN}$ which is fed back to the charge pumps and input into the voltage-controlled oscillator to set the PLL circuit to a desired bias. Such a bias may be set in accordance with any one of a variety of known techniques including but not limited to those disclosed in U.S. Pat. No. 6,329,882 assigned to Intel Corporation. Second, the loop filter capacitor functions as a low-pass filter which is desirable because it provides stability to the operation of the PLL circuit.

The output of charge pump 2 is input into a resistor 9 and a second capacitor 10. The resistor may be implemented by transistors and its value dynamically adjusted based on the nbias voltage. Connecting the second capacitor in parallel with the resistor is advantageous because it serves to further reduce feed-through jitter.

The second capacitor also prevents the control voltage for the voltage-controlled oscillator from changing too rapidly, by integrating the current pulses output from the second charge pump. The amplitude of the resultant voltage pulse at the VCO steering line is substantially reduced. As a result, the second charge pump becomes stable over time and output jitter performance is significantly enhanced. Also, it is noted that adding the second capacitor to the PLL changes the circuit from a second-order to a third-order phase-locked loop. The output of the bias generator is coupled with the output from the second charge pump, once having passed resistor 9 and capacitor 10, to control the VCO frequency in a manner that reduces or eliminates the differences between the reference and feedback frequencies input into the phase- and frequency detector.

Phase-locked loops of the aforementioned type must be initialized before a lock condition can be achieved. More specifically, at power on the bias voltages of the PLL are zero, e.g., $V_{BN}=0$ and $V_{cntl}=V_{CCA}$. Under these conditions, the charge pump currents are zero and the voltage-controlled oscillator is not biased, i.e., not oscillating. Consequently, the phase-locked loop is not functional.

To place the PLL in a functional state (i.e., one that will allow phase lock to take place, otherwise know as normal acquisition mode), a controller 20 may be included. This controller provides enough bias to the charge pumps and voltage-controlled oscillator to allow lock to occur, i.e., generate VCO oscillations and charge pump currents sufficient to ensure that phase/frequency correction can take place. This bias may, for example, result in $V_{cntl}=V_{BP}$. Also, it is noted that since $V_{BN}$ is generated according to $V_{cntl}$ by the bias generator circuit (e.g., see FIG. 1), setting $V_{cntl}$ to half $V_{CCA}$ will automatically set $V_{BN}$ to a value that will achieve a DC bias sufficient to allow adequate oscillation to take place and thus the PLL to lock. A more detailed description of the functions performed by the controller now follows.

Figure 2:
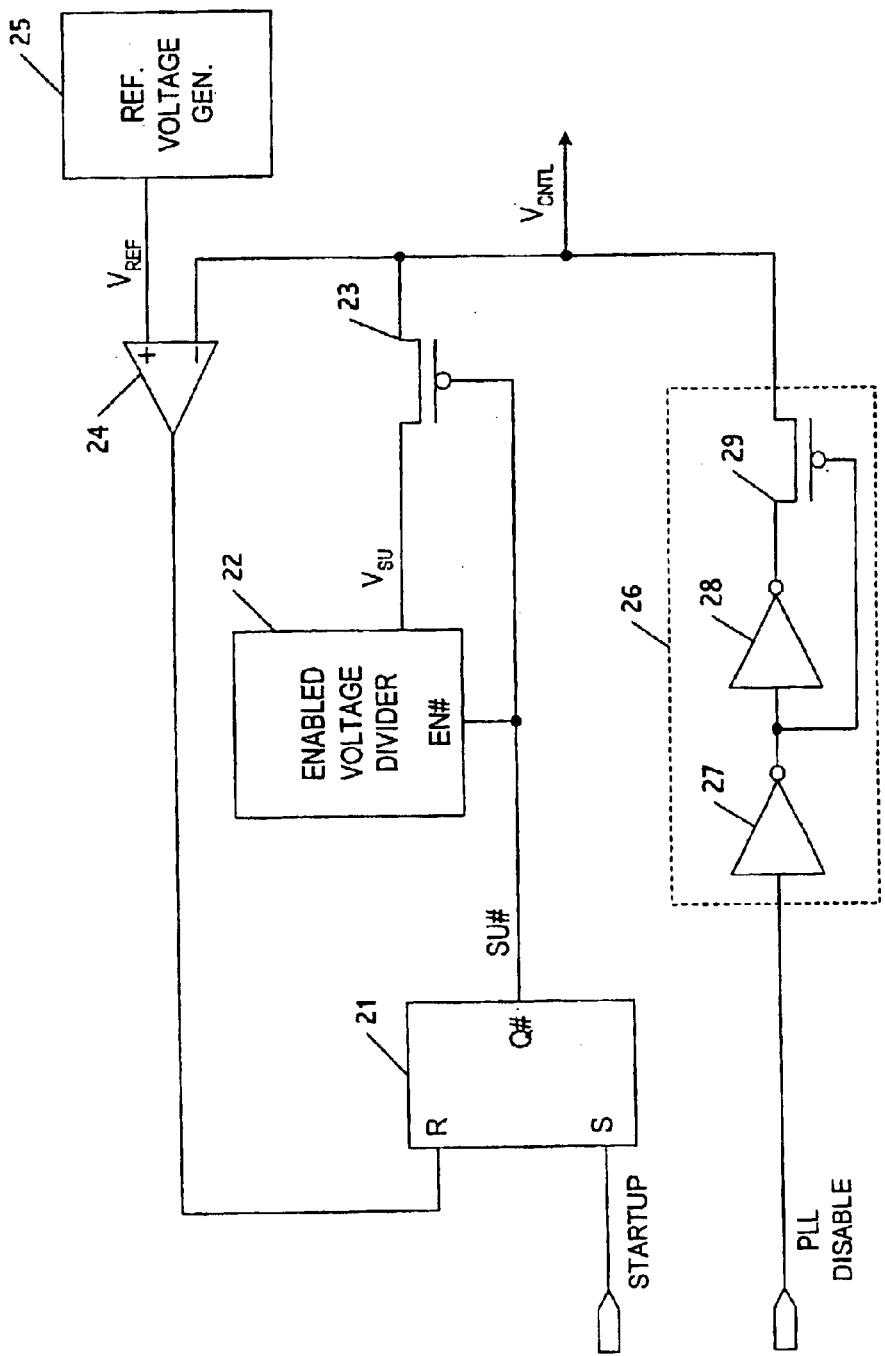
FIG. 2 is a diagram showing a controller for transitioning the phase-locked loop of FIG. 1 from a startup condition to a normal acquisition mode.

Controller 20 controls the phase-locked loop to transition from a startup conditions to normal acquisition mode by setting the control voltage of the VCO. Referring to FIG. 2, one embodiment of the first controller includes an RS latch 21, an enable voltage divider 22, a PMOS transistor 23, and a comparator 24. The S input of the RS latch receives a startup enable signal. The complemented output of the latch Q# is connected to a complemented enable terminal en# of the voltage divider and to the gate of the PMOS transistor. The output of the voltage divider is connected to the source of this transistor and is passed to the VCO control node $V_{cntl}$ of the phase-locked loop. The comparator compares the control voltage $V_{cntl}$ to a reference voltage $V_{ref}$ output from a reference voltage generator 25, and the output of the comparator is connected to the R input of the latch. The first controller also includes a disable circuit 26 which includes two inverters 27 and 28 connected in series. The output of the second inverter is connected to a PMOS transistor 29, whose gate is controlled by the output of the first inverter, and the drain of this transistor is connected to control node $V_{cntl}$ The disable circuit is activated by the assertion of a PLL disable signal, during which time the startup enable signal is de-asserted.

Operation of the first controller will now be described when the PLL is in startup mode. At power on, bias voltage $V_{BN}=0$ and the voltage at control node $V_{cntl}=V_{CCA}$. Under these conditions, the charge pump currents are zero and the voltage-controlled oscillator is not biased and thus not oscillating. Consequently, the phase-locked loop is not functional. To initialize and thus place the PLL in normal acquisition mode (i.e., one that will allow phase lock to take place), the following steps may be performed.

Initially, controller 20 receives a startup enable signal to begin the transition process. This enable signal may be generated, for example, from the second controller or from another control unit of the host system of the PLL. This signal is input into the S terminal of latch 21, thereby setting the Q# output to a low logic value. The low output of the latch enables voltage divider 22 and switches transistor 23 on. As a result, a startup voltage $V_{su}$ is passed to the $V_{cntl}$ node of the phase-locked loop.

Outputting voltage $V_{su}$ to the $V_{cntl}$ node causes the $V_{cntl}$ node to swing down to a value lower than the reference voltage $V_{ref}$. This lower value may be a predetermined value such as, for example, $V_{CCA}/2$, but those skilled in the art can appreciate that $V_{ref}$ may be set to other values. Decreasing the voltage at node $V_{cntl}$ causes bias voltage $V_{BN}$ to increase and this will continue for as long as the voltage of the control node is affected. This effect may be explained as follows.

$V_{cntl}$ may be considered to be the DC bias for one or more p-channel transistor of the PLL. The sources of these transistors may be connected to $V_{CCA}$ and their gates to $V_{cntl}$. Accordingly, when $V_{cntl}=V_{CCA}$ the gate-source voltage of the p-channel transistors is 0 V which thereby shuts them off When $V_{cntl}$ is reduced, the gate-source voltage increases and the transistors conduct current. Then, when the PLL disable signal is asserted $V_{cntl}$ is charged to $V_{CCA}$ via transistor 29. When PLL start-up begins, the PLL disable signal is de-asserted and the StartUp signal is asserted. This causes $V_{cntl}$ to discharge to the Enabled Voltage Divider output value via transistor 23.

When $V_{cntl}<V_{ref}$, the bias voltage causes the VCO and charge pumps to reach a state which will allow the phase-locked loop to operate in normal acquisition mode (e.g., a mode where phase or frequency lock can take place). Put differently, when biased in this manner the current from one or both charge pumps is sufficient to determine a significant change in $V_{cntl}$ if the error measured by the phase-frequency detector of the PLL is high. The gain of the VCO is also sufficiently high to ensure that phase lock can occur. Also, when $V_{cntl}<V_{ref}$, the comparator toggles and resets the RS latch. As a result, the signal SU# output from the latch goes to a high logical value, thereby disabling the voltage divider, switching off transistor 23, and effectively de-activating controller 20. The controller thus provides enough bias voltage to the VCO and charge pumps ($V_{BN}$, $V_{BP}=V_{cntl}$ at power on to allow the PLL to transition from startup mode to acquisition mode.

In addition to performing startup control, controller 20 may perform a yank operation which involves correcting the output of the PLL to a desired frequency or to within a desired frequency range when $F_{in}$ is low by a predetermined amount.

Figure 3:
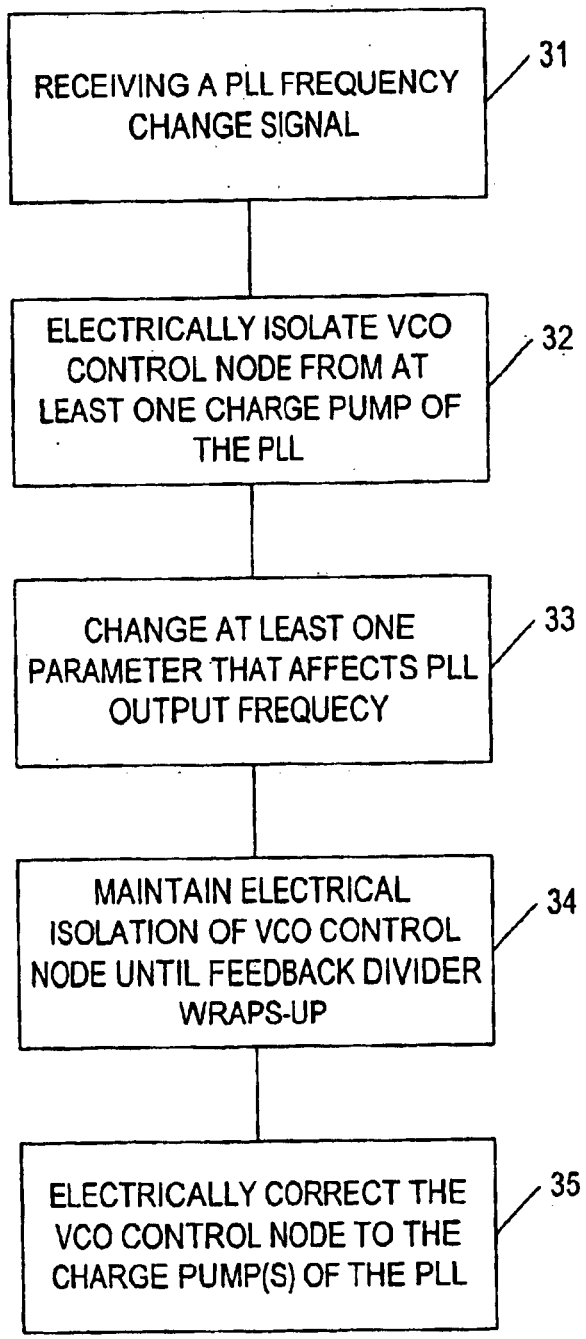
FIG. 3 is a diagram showing steps included in a method for controlling the lock time of a phase-locked loop in accordance with a first embodiment of the present invention.

For any one of a variety of reasons, it may be desirable to alter the output frequency of the PLL at some point during its operation. In order to change the output frequency of the phase-locked loop, the PLL shown in FIG. 1 may include a controller 30. Operation of this controller in accordance with one embodiment of the present invention will be discussed with reference to the flow diagram of FIG. 3, which show steps included in a method for controlling a phase-locked loop in accordance with a first embodiment of the present invention.

In an initial step, a frequency change signal is generated. (Block 31). This signal may be internally generated by controller 30 based on the detection of a particular operating mode of its host system. Alternatively, the signal may be generated by an external processor (not shown) which performs or receives information from a circuit which performs a similar detection function. The external processor may then convey this signal to controller 30. The frequency change signal may also be generated under other circumstances.

In a second step, control node $V_{cntl}$ which controls the output frequency of the voltage-controlled oscillator (and thus the PLL) is electrically isolated from the first charge pump 3. (Block 32). This may be accomplished by controller 30 generating a disable signal for disabling at least one of the first and second charge pumps 2 and 3. Preferably, both charge pumps are disabled by the disable signal. Disabling both charge pumps places the phase-locked loop in an open-loop state (e.g., CP high-impedance) with respect to all subsequent circuit elements. As a result, the voltage at control node $V_{cntl}$ advantageously does not change.

More specifically, when charge pumps 2 and 3 are disabled the $V_{cntl}$ node maintains the same voltage it had before the frequency change signal was generated. This is because in the open-loop state the charge stored in capacitor (C1) 8 of the loop filter does not change, e.g., is not affected by the output of the now-disabled first charge pump, nor is it altered by any sinking or pumping current sources that may be connected to the control node. Startup/yank controller 20 may also be disabled at this time, which further ensures that control node $V_{cntl}$ maintains a constant value. One effect of maintaining the voltage at control node $V_{cntl}$ is to ensure that the frequency $F_{out}$ generated by the VCO does not change. This proves to be beneficial for reasons that will become more apparent below.

In a third step, controller 30 outputs a signal to change at least one parameter of the phase-locked loop. (Block 33). The parameter is preferably one which can effect a change in the output frequency of the phase-locked loop from a frequency $F_{out1}$ (output before the frequency change signal) was generated to a newly desired frequency $F_{out2}$. In accordance with one embodiment of the invention, this parameter is the value N of the feedback divider 7. Alternatively, the parameter may be the reference frequency $F_{ref}$ input into the phase-frequency detector of the PLL. Other parameters may be changed if desired. Moreover, controller 30 may generate signals for altering a combination of parameters of the PLL, including but not limited to N and $F_{ref}$. The following PLL parameters may also be changed: charge pump current, VCO gain, and resistor values. All of these parameters will lead to a change in the PLL transfer function that can benefit a particular application without a requirement to change the VCO frequency. The new frequency $F_{out2}$ may be less than or greater than $F_{out1}$ depending upon, for example, the circumstances under which the frequency change signal was generated.

In a fourth step, the charge pump disable signal is maintained for a period of time sufficient to allow the feedback divider to wrap-up. (Block 34). This wrap-up condition may be explained as follows. A programmable divider is a logic circuit having an output clock frequency that corresponds to a divided or fractional amount of its input clock frequency. The division value (N) is programmed by one or more input bits loaded into counter state elements at a certain time. The counter wrap-up time corresponds to the time between the loading of these input bits into the counter and the time when the output clock frequency is equal to the input clock frequency divided by the new counter division value. During this process, the divided output clock frequency is unknown since it is affected by state elements status at the moment they were programmed. Those skilled in the art can appreciate that the fourth step may be performed only if the value N of the feedback divider is one of the parameters altered by the controller.

In a fifth step, control node $V_{cntl}$ is once again electrically connected to the charge pump. (Block 35). This may be accomplished by de-asserting the disable signal input into the first and second charge pumps. When this signal is de-asserted, the first charge pump is once again electrically connected to the $V_{cntl}$ node. However, this time the first charge pump outputs current to $V_{cntl}$ in an amount consistent with the parameter change effected by controller 30. As a result, the voltage at $V_{cntl}$ changes by an amount sufficient to ensure that the PLL output frequency locks on to the new frequency $F_{out2}$.

The foregoing method outperforms other methods which have been proposed for controlling the frequency transition of a phase-locked loop circuit. Other control methods, for example, change PLL frequency by performing three processes in sequence: a startup process, a frequency acquisition process, and a phase-lock process.

During the startup process, the voltage at control node $V_{cntl}$ is changed to a predetermined value that is not related to a control voltage which will eventually result in producing the newly desired output frequency $F_{out2}$. The voltage change is performed when a startup control circuit monotonically discharges the loop-filter capacitor from an initial value (e.g., $V_{CCA}$) to a much lower value, e.g., approximately $V_{CCA}/2$. When this lower value is reached, the voltage-controlled oscillator outputs a frequency which is not related to $F_{out2}$. The startup process then comes to an end. At this point, it is noted that the startup process delays the lock time of the phase-locked loop by a significant amount of time, typically 1 μs or more.

During the frequency acquisition process, the loop filter of the PLL is monotonically changed in order to change $V_{cntl}$ from one value ($V_{CCA}/2$) to a value which will cause the VCO to output the desired frequency $F_{out2}$. Because voltage $V_{cntl}$ was changed to a predetermined voltage that is is not related to $F_{out2}$ during the startup process, it is clear that changing this voltage to the value that will produce $F_{out2}$ takes a considerable amount of time (e.g., 0.8 μs or more), which further delays the lock time of the phase-locked loop.

During the phase-lock process, the reference and feedback signals input into the phase-frequency detector are corrected to be in-phase. This results in the PLL locking on to the desired frequency $F_{out2}$ at a time when charge-pump activity is non-monotonic. The phase-lock step adds an additional delay to the lock time of the PLL, typically 0.14 μs.

At least one embodiment of the method of the present invention significantly reduces the lock time of the phase-locked loop compared with the other proposed methods described above. This is achieved by completely eliminating the startup process and significantly reducing the frequency acquisition process during frequency transition. The startup process is eliminated by maintaining the voltage of control node $V_{cntl}$ at the same value that existed prior to the generation of a frequency change signal. This eliminates the step performed by other methods of pulling this voltage up to a predetermined low value, e.g., $V_{CCA}$.

The time to perform the frequency acquisition process is also substantially reduced. By not changing the voltage at control node $V_{cntl}$, a high voltage at $V_{cntl}$ is maintained. Thus, only a relatively small change in $V_{cntl}$ needs to be effected in order to generate the newly desired output frequency $F_{out2}$. The same is not true of the other control methods. In these other methods, $V_{cntl}$ is reduced to a low value (e.g., $V_{CCA}/2$ during the startup process). Consequently, the difference between this low value and the voltage required to generate desired frequency $F_{out2}$ is large. A large change in $V_{cntl}$ therefore needs to be effected in order to generate the newly desired output frequency $F_{out2}$. The time required to make this change is significantly longer than the frequency acquisition time of the method of the present invention in accordance with the embodiment described above.

Eliminating the startup process and reducing the time of the frequency acquisition process reduces the lock time of the PLL. This translates in to faster and more efficient performance of any system incorporating or in communication with the phase-locked loop.

A second embodiment of the method of the present invention may be adapted to control the frequency of a phase-locked loop in response to a SpeedStep® transition command. SpeedStep® is a power-saving technology developed by Intel Corporation which may be applied to any one of a number of electronic devices, including but not limited to personal, notebook, and laptop computers, personal digital assistants (PDAs), and a variety mobile and handheld processing and communications devices. According to at least one version of the SpeedStep® technology, battery charge is preserved by reducing the speed of the central processing unit (CPU) of the device. Reducing CPU speed causes the device to consume less power. Also, less heat is generated which reduces cooling requirements. SpeedStep® technology has been applied to reduce CPU frequency when the device (e.g., host system) switches from an AC adapter power mode to a battery power mode. When applied in this manner, the frequency reduction achieved by SpeedStep® preserves battery power. Of course, SpeedStep® may be applied to increase the frequency when the host system returns, for example, to AC adapter power. It is further noted that the SpeedStep® transition command may be triggered under other conditions. For example, when it is desired to drive the system at low frequency/low power when only limited performance is required and at high frequency/high power when higher performance is demanded.

Figure 4:
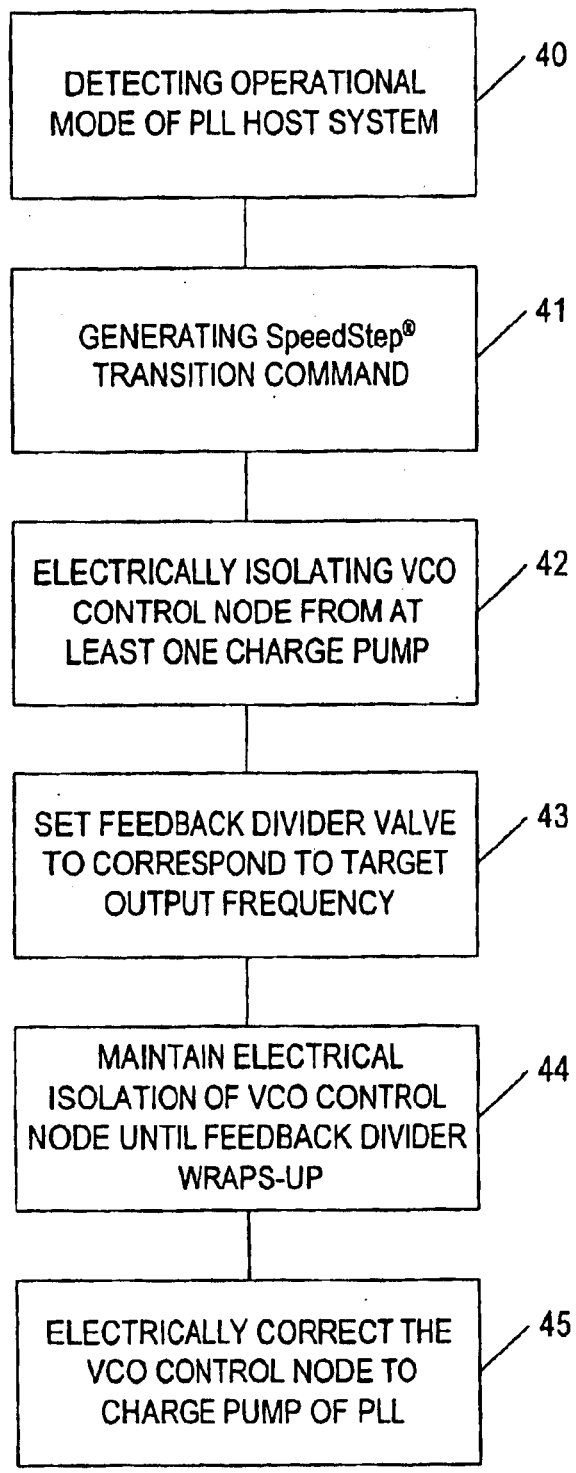
FIG. 4 is a diagram showing steps included in a method for controlling the lock time of a phase-locked loop in accordance with a second embodiment of the present invention.

FIG. 4 shows steps included in the second embodiment of the method of the present invention. In an initial step, a mode of operation of the host system containing the phase-locked loop is detected. In this SpeedStep® embodiment, the mode of operation may be one of a battery power mode and an AC adapter power mode. (Block 40).

In a second step, a SpeedStep® transition command is generated. (Block 41). This signal may be internally generated by controller 30 based on the detected mode of operation of the host system. The detection function may be performed by controller 30 or a detector circuit coupled to this controller, and may involve determining whether a battery is connected to the host system. Detection circuits of these and other types are known to those skilled in the art. As an alternative, the SpeedStep® transition command may be generated by an external processor which performs or receives information from a circuit which performs a similar detection function. The external processor may then convey this signal to the controller.

In a third step, control node $V_{cntl}$ which controls the output frequency of the voltage-controlled oscillator (and thus the PLL) is electrically isolated from the first charge pump 3. (Block 42). This is accomplished by controller 30 generating a disable signal for disabling first and second charge pumps 2 and 3. Disabling both charge pumps places the phase-locked loop in an open-circuit (e.g., CP high-impedance) state with respect to all subsequent circuit elements. As a result, the voltage at control node $V_{cntl}$ advantageously does not change, e.g., remains at a constant value along with the output frequency of the VCO.

In a fourth step, controller 30 outputs a signal to program feedback divider 7 to a value that reflects the SpeedStep® target frequency. (Block 43). The target frequency is either higher or lower than the PLL output frequency that existed before the SpeedStep® transition command depending on the operational mode detected. If the operational mode is detected to be a battery power mode, the target frequency is a lower frequency. If the operational mode is detected to be AC adapter power mode, the target frequency is a higher frequency. Since control node $V_{cntl}$ is electrically isolated from the charge pumps, changing the value of divider 7 does not affect the value of the control node.

In a fifth step, the charge pump disable signals output from controller 30 are maintained for a period of time sufficient to allow the feedback divider to wrap-up, for example, in a manner previously described. (Block 44).

In a sixth step, control node $V_{cntl}$ is once again electrically connected to the charge pump. (Block 45). This may be accomplished by de-asserting the disable signal input into the first and second charge pumps. When this signal is de-asserted, the first charge pump is once again electrically connected to the $V_{cntl}$ node. However, this time the first charge pump outputs current to $V_{cntl}$ in an amount consistent with the new divider value. As a result, the voltage at $V_{cntl}$ changes by an amount sufficient to ensure that the PLL output frequency locks on to the new frequency $F_{out2}$.

The second embodiment of the method of the present invention also outperforms other control methods which have been proposed. Like in the first embodiment, the second embodiment completely omits a startup process. And, by maintaining $V_{cntl}$ at least a substantially constant voltage, a significantly reduced frequency acquisition process is performed. The frequency acquisition process is followed by a phase-lock process. (Both processes have been discussed in detail above.) By taking this approach, the second embodiment of the method of the present invention substantially reduces the lock time of the PLL. The following example is illustrative of this superior performance.

In a self-biased phase-locked loop employing the other proposed methods, the time required for performing a frequency acquisition process may be expressed by Equation 1:

$$\Delta T_{freq} = \frac{C_1 \Delta V}{\alpha I_{CP}} \qquad (1)$$

where $C_1$ is the capacitance of the loop-filter capacitor, $\Delta V$ is the voltage difference between the loop-filter capacitor voltage before frequency change and the loop-filter capacitor voltage after frequency change (this value reflects the change required of the VCO control voltage to change the VCO frequency to its final value), $I_{CP}$ is the charge pump current at $V_{CCA}/2$, and $\alpha$ is the charge pump current average factor that reflects the change of charge pump current over the VCO frequency range (in a self-biased PLL, the charge pump current is set by the PLL DC bias that varies with the VCO frequency).

The time required for performing a phase-lock process may be expressed by Equation (2):

$$\Delta T_{phase} = \frac{\xi}{BW} \qquad (2)$$

where $\xi$ is the PLL dumping factor and BW is the PLL bandwidth.

When typical values are plugged into Equations 1 and 2 ($C_1$=100 pf, $\Delta V$=0.24 V, $I_{CP}$=100 $\mu$A, $\alpha$=0.3, $\xi$=0.7, BW=5 MHz, and VCO gain=5 GHz/V), the duration of the frequency acquisition process is 0.8 $\mu$s and the duration of the phase-lock process is 0.14 $\mu$s. The time required to perform the startup process is longest of the three processes, typically 1 $\mu$s. Adding these three time values, it is apparent that the total lock time of the PLL is typically on the order of 1.94 $\mu$s. For systems (e.g., clock generators) which use cascaded PLLs, the overall lock time equals the sum of the lock times of the individual PLLs.

The second embodiment of the method of the present invention achieves a much faster lock time. First, because no startup process is performed it is clear that the method does not realize the 1 $\mu$s delay which the other control methods experience. The frequency acquisition process is also shorter since the maximum frequency gap defined by the Speed-Step® technology can be one bin (i.e., 100 MHz). This reduced frequency gap significantly reduces the amount of change in $V_{cntl}$ required to lock on to the new frequency. This amount of change may, for example, be $\Delta V$=0.02 V (reflecting a 100 MHz change of the core clock frequency). Using Equations 1 and 2 with the same PLL values but with $\Delta V$=0.02 substituted, it is apparent that the frequency acquisition process takes 0.06 $\mu$s to perform. The phase-lock process does not change in this particular example and thus remains at 0.14 $\mu$s. Adding these values, the second embodiment of the method of the present invention advantageously achieves a PLL lock time of 0.2 $\mu$s, which is 1.74 $\mu$s reduction in time compared with the other control methods. This is a very significant reduction (almost an order of 10), which advantageously translates into much faster performance by host system of the PLL.

Figure 5:
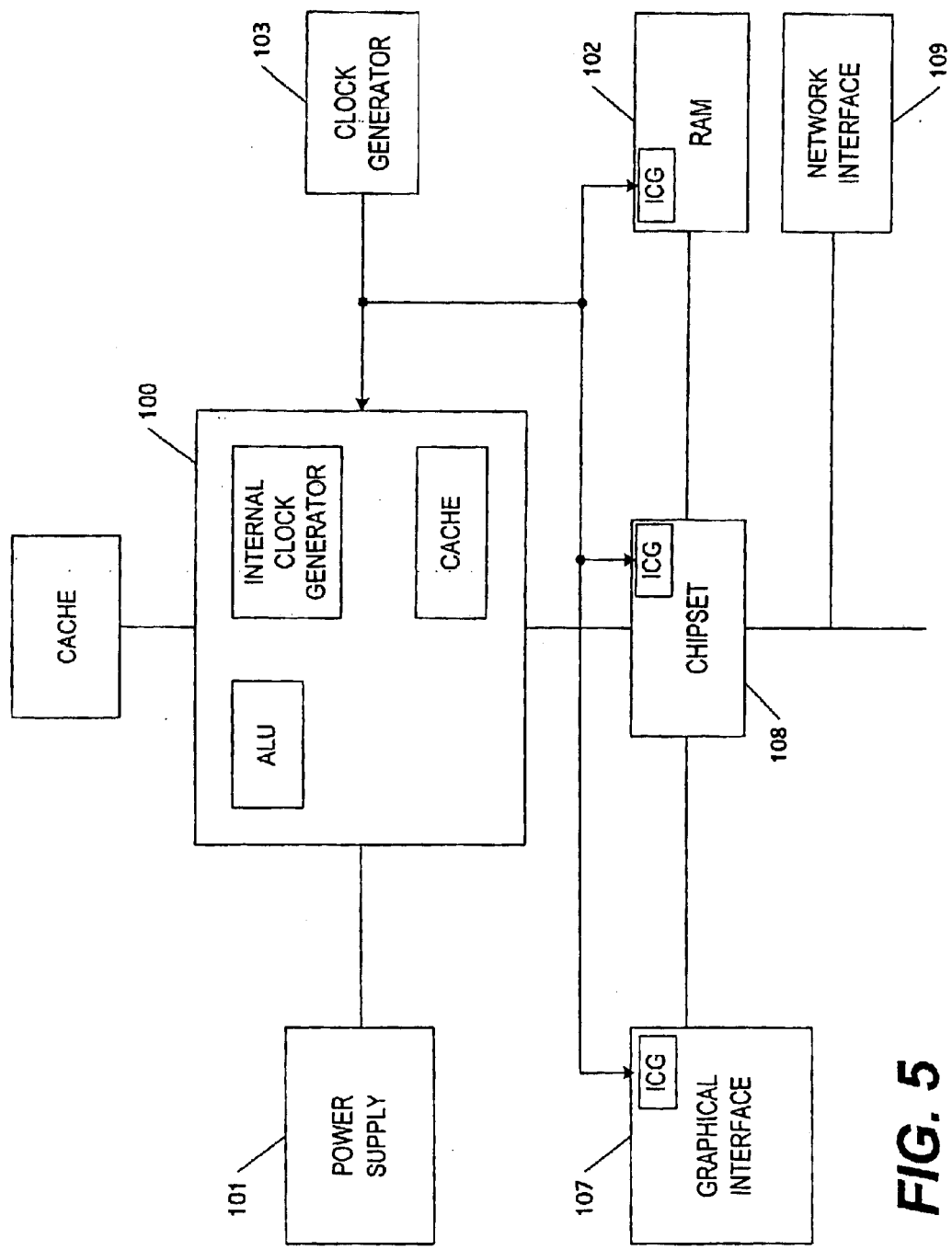
FIG. 5 is a diagram showing a processing system which includes a controller in accordance with the embodiment of the present invention shown in FIG. 1.

FIG. 5 is a diagram of processing system in accordance with one embodiment of the present invention. The processing system includes a processing chip 100, a power supply 101, a memory 102, and a clock generator 103 which includes a phase-locked loop in accordance with the present invention. The phase-locked loop may be a self-biased PLL if desired. The processing chip may be a microprocessor, ASIC, or some other processor, and may include an arithmetic logic unit (ALU) 104 and a cache 105. While the clock generator is shown as residing off-chip, those skilled in the art can appreciate that the clock generator may also be formed on-chip (internal clock generator 106) in order to reduce space and thus promote miniaturization. Usually, at system level, one clock generator may be used to perform synchronization between or among components. The processing system may further include a graphical interface 107, a chipset 108, and a network interface 109. Each component may have its own internal clock generator, illustratively shown as (ICG) in FIG. 5. One of more of these ICGs may include a PLL in accordance with any of the embodiments of the present invention described herein.

The embodiments of the apparatus and method of the present invention may be modified in various ways. For example, while controller 30 has been described as controlling a frequency change in a self-biased phase-locked loop, those skilled in the art can appreciate that this controller may also be used to perform a frequency change in a PLL that is not self-biased, e.g., one which has only a single charge pump. When applied to such a PLL, the controller may be perform functions analogous to those previously discussed. Also, it is noted that a single or cascaded chain of PLLs implementing the method may be used to form a clock generator which performs a deterministic relock sequence.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A frequency generator, comprising:
    a phase-locked loop which includes at least one charge pump and an oscillator; and
    a controller to electrically isolate a node of the phase-locked loop from said at least one charge pump in response to a frequency change signal, wherein a voltage at said node controls an output frequency of the oscillator, wherein the controller changes a parameter of the phase-locked loop during a time when said node is electrically isolated from said at least one charge pump, and wherein said changed parameter is one for altering the output frequency of the oscillator from a first frequency to a second frequency.

2. The frequency generator of claim 1, wherein the phase-locked loop includes a loop filter, and wherein said controller sets the voltage at said node based on an output of the loop filter.

3. The frequency generator of claim 2, wherein said controller sets the voltage at said node based on a charge stored in a capacitor of the loop filter before the frequency change signal was received.

4. The frequency generator of claim 1, wherein said controller electrically isolates said node by disabling said at least one charge pump.

5. The frequency generator of claim 1, wherein the second frequency is lower than the first frequency.

6. The frequency generator of claim 1, wherein second frequency is higher than the first frequency.

7. The frequency generator of claim 1, wherein said controller changes the output frequency of the oscillator by setting a feedback divider coupled to a phase-frequency detector of the phase-locked loop to a value which corresponds to the second frequency, and electrically connecting said node of the phase-locked loop to said at least one charge pump.

8. The frequency generator of claim 7, wherein said controller electrically isolates said node by disabling said at least one charge pump and electrically connects said node by enabling said at least one charge pump.

9. The method of claim 1, wherein the phase-locked loop is a self-biased phase-locked loop which includes first and second charge pumps.

10. The method of claim 9, wherein said controller disables said first and second charge pumps in response to said frequency change signal.

11. A method for controlling a phase-locked loop having at least one charge pump coupled to an oscillator, comprising:
    receiving a frequency change signal;
    electrically isolating a node of the phase-locked loop from said at least one charge pump, wherein a voltage at said node controls an output frequency of the oscillator; and
    changing a parameter of the phase-locked loop during a time when said node is electrically isolated from said at least one charge pump, wherein said changed parameter is one for altering the output frequency of the oscillator from a first frequency to a second frequency.

12. The method of claim 11, further comprising:
    setting the voltage at said node based on an output of a loop filter of the phase-locked loop.

13. The method of claim 12, wherein setting the voltage includes:
    setting the voltage at said node based on a charge stored in a capacitor of the loop filter before the frequency change signal was received.

14. The method of claim 11, wherein electrically isolating said node includes: disabling said at least one charge pump.

15. The method of claim 11, wherein the second frequency is lower than the first frequency.

16. The method of claim 11, wherein second frequency is higher than the first frequency.

17. The method of claim 11, wherein changing the output frequency of the oscillator includes:
    setting a feedback divider coupled to a phase-frequency detector of the phase-locked loop to a value which corresponds to the second frequency; and
    electrically connecting said node of the phase-locked loop to said at least one charge pump.

18. The method of claim 17, wherein electrically isolating said node includes disabling said at least one charge pump and electrically connecting said node includes enabling said at least one charge pump.

19. The method of claim 11, wherein the phase-locked loop is a self-biased phase-locked loop which includes first and second charge pumps.

20. The method of claim 18, further comprising:
    disabling said first and second charge pumps in response to said frequency change signal.

21. An method for controlling power consumption in a system which includes a phase-locked loop, said phase-locked loop including at least one charge pump and an oscillator, comprising:
    detecting a mode of operation of the system;
    electrically isolating a node of the phase-locked loop from said at least one charge pump in response to the detected mode of operation, said node having a voltage which controls an output frequency of the oscillator; and
    modifying at least one parameter to change the output frequency of the oscillator from a first frequency to a second frequency while said node is electrically isolated from said at least one charge pump, said second frequency corresponding to a desired power consumption during said detected mode of operation.

22. The method of claim 21, wherein the detected mode of operation is a battery power mode, and wherein the second frequency is less than the first frequency.

23. The method of claim 21, wherein the detected mode of operation is an AC power mode, and wherein the second frequency is greater than the first frequency.

24. The method of claim 21, wherein said at least one parameter is selected from the group consisting of a value, of a feedback divider coupled to a phase-frequency detect of the phase-locked loop and a reference frequency input into the phase-frequency detector.

25. The method of claim 21, wherein electrically isolating said node includes disabling said at least one charge pump and setting the voltage at said node based on a charge stored in a capacitor of the loop filter before the mode of operation was detected.

26. The method of claim 21, further comprising:
    electrically connecting said at least one charge pump to said node after said at least one parameter is modified.

27. A processing system, comprising:
    a circuit; and
    a frequency generator which supplies a frequency signal to the circuit, said frequency generator including:
    (a) a phase-locked loop which includes at least one charge pump and an oscillator;
    (b) a controller to electrically isolate a node of the phase-locked loop from said at least one charge pump in response to a frequency change signal, wherein a voltage at said node controls an output frequency of the oscillator; and
    (c) changing a parameter of the phase-locked loon during a time when said node is electrically isolated from said at least one charge pump, wherein said changed parameter is one for altering the output frequency of the oscillator from a first frequency to a second frequency.

28. The processing system of claim 27, wherein the circuit includes one of a CPU, a memory, a chipset, and an interface.

29. The frequency generator of claim 1, wherein the frequency change signal includes a transition command for reducing a speed of a processor-driven device incorporating the frequency generator.

30. The frequency generator of claim 1, wherein the frequency change signal includes a transition command for reducing power consumed by a processor-driven device incorporating the frequency generator.

31. The frequency generator of claim 1, wherein the parameter is a value of a frequency divider and wherein the controller electrically isolates said node from said at least one charge pump for a period of time which includes a wrap-up time of the frequency divider.

32. The frequency generator of claim 1, wherein the controller electrically isolates at least one of a start-up controller or yank controller coupled to the phase-locked loop while said node is electrically isolated from said at least one charge pump.

33. The frequency generator of claim 1, wherein the controller electrically connects said node to said at least one charge pump after the parameter is changed.

34. The frequency generator of claim 33, wherein the parameter is a value of a frequency divider of the phase-locked loop, and wherein the controller electrically connects said node to said at least one charge pump after a wrap-up time of the frequency divider.

35. The frequency generator of claim 10, wherein the first charge pump is coupled to a loop filter and the second charge pump is coupled to the oscillator, and wherein a capacitor and a resistor, connected in parallel, are disposed between the second charge pump and oscillator.

36. The method of claim 11, wherein the frequency change signal includes a transition command for reducing a speed of a processor-driven device incorporating the phase-locked loop.

37. The method of claim 11, wherein the frequency change signal includes a transition command for reducing power consumed by a processor-driven device incorporating the phase-locked loop.

38. A method for controlling a phase-locked loop having at least one charge pump coupled to an oscillator, comprising:

receiving a frequency change signal;

changing a frequency of the oscillator in response to the frequency change signal;

maintaining a control node voltage of the phase-locked loop at a substantially constant value both before and after receipt of the frequency change signal.

39. The method of claim 38, wherein the control node is coupled to a loop filter of the phase-locked loop.

40. The method of claim 38, wherein the oscillator frequency is changed without performing a startup process.

41. The method of claim 38, wherein said substantially constant value corresponds to a voltage sufficient to sustain a normal acquisition mode of operation of the phase-locked loop.

42. The method of claim 38, wherein changing the frequency includes:

electrically isolating the control node from said at least one charge pump; and changing a parameter of the phase-locked loop during a time when said node is electrically isolated from said at least one charge pump.

43. The method of claim 38, wherein the frequency change signal includes a transition command for reducing a speed of a processor-driven device incorporating the frequency generator.

44. The method of claim 38, wherein the frequency change signal includes a transition command for reducing power consumed by a processor-driven device incorporating the frequency generator.

* * * * *